(12) United States Patent
Choi et al.

(10) Patent No.: US 11,294,235 B2
(45) Date of Patent: Apr. 5, 2022

(54) OPTICAL FILM FOR MINI LED OR MICRO LED BACKLIGHT UNIT

(71) Applicant: LMS Co., Ltd., Pyeongtaek-si (KR)

(72) Inventors: Yong Won Choi, Suwon-si (KR); Ho Seong Na, Anyang-si (KR); Min Soo Lee, Anyang-si (KR); Woo Joo Lah, Yongin-si (KR)

(73) Assignee: LMS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/131,213

(22) Filed: Dec. 22, 2020

(65) Prior Publication Data

US 2021/0124217 A1 Apr. 29, 2021

Related U.S. Application Data

(63) Continuation of application No. PCT/KR2019/007279, filed on Jun. 17, 2019.

(30) Foreign Application Priority Data

Jun. 28, 2018 (KR) .......................... 10-2018-0074927

(51) Int. Cl.
*G02F 1/00* (2006.01)
*G02F 1/1335* (2006.01)
*G02F 1/13357* (2006.01)

(52) U.S. Cl.
CPC .. *G02F 1/133607* (2021.01); *G02F 1/133603* (2013.01)

(58) Field of Classification Search
CPC ........ G02F 1/133607; G02F 1/133603; H05K 1/111
See application file for complete search history.

(56) References Cited

U.S. PATENT DOCUMENTS

| | | | | |
|---|---|---|---|---|
| 2006/0285352 | A1* | 12/2006 | Kim ..................... | G02B 6/0051 362/558 |
| 2010/0027295 | A1* | 2/2010 | Lee ........................ | G02B 5/045 362/622 |
| 2010/0265434 | A1* | 10/2010 | Kim ..................... | G02B 5/0221 349/64 |
| 2011/0032453 | A1* | 2/2011 | Moon .................. | G02B 5/0242 349/64 |

(Continued)

FOREIGN PATENT DOCUMENTS

| | | |
|---|---|---|
| CN | 102830449 A | 12/2012 |
| CN | 104166175 A | 11/2014 |

(Continued)

OTHER PUBLICATIONS

Korean Notice of Allowance dated Jan. 20, 2020 issued in corresponding Patent Application No. 10-2018-0074927 (5 pages).

(Continued)

*Primary Examiner* — Gerald J Sufleta, II
(74) *Attorney, Agent, or Firm* — Polsinelli PC

(57) ABSTRACT

An optical film for efficiently and uniformly diffuses and collects the light from mini LEDs or micro LEDs, the bead diffusion layer and the pattern diffusion layer of the first diffusion sheet are formed such that a first diffusion rate of the light on the one surface of the first diffusion sheet is higher than a second diffusion rate of the light on the other surface of the first diffusion sheet.

9 Claims, 4 Drawing Sheets

(56) References Cited

U.S. PATENT DOCUMENTS

| | | | |
|---|---|---|---|
| 2011/0096402 A1* | 4/2011 | Sun | G02B 1/04 |
| | | | 359/599 |
| 2014/0340911 A1* | 11/2014 | Woo | G02B 5/0242 |
| | | | 362/311.03 |
| 2015/0285444 A1 | 10/2015 | Choi et al. | |
| 2015/0301257 A1* | 10/2015 | Choi | F21V 3/049 |
| | | | 362/607 |
| 2017/0153362 A1* | 6/2017 | Cho | G02B 5/0226 |
| 2017/0153363 A1* | 6/2017 | Lee | G02F 1/133606 |
| 2017/0329160 A1* | 11/2017 | Konuma | G02B 5/0242 |
| 2018/0188589 A1* | 7/2018 | Han | G02F 1/133504 |

FOREIGN PATENT DOCUMENTS

| | | |
|---|---|---|
| JP | 2012-078852 A | 4/2012 |
| KR | 10-2009-0096295 A | 9/2009 |
| KR | 10-2011-0126776 A | 11/2011 |
| KR | 10-2012-0020668 A | 3/2012 |
| KR | 10-2014-0060222 A | 5/2014 |
| KR | 10-1392347 B1 | 5/2014 |
| KR | 10-2015-0054468 A | 5/2015 |
| WO | 2010/047557 A2 | 4/2010 |
| WO | 2012/064562 A1 | 5/2012 |

OTHER PUBLICATIONS

Chinese Office Action dated Dec. 13, 2021 issued in counterpart Patent Application No. 201980037239.7 (4 pages).
Chinese Search Document issued in counterpart Patent application No. 201980037239.7 (3 pages).

* cited by examiner

OPTICAL FILM FOR MINI LED OR MICRO LED BACKLIGHT UNIT

CROSS-REFERENCE TO RELATED APPLICATION

This application is a continuation application of International Application No. PCT/KR2019/007279 filed on Jun. 17, 2019, which claims priority to Korean Application No. 10-2018-0074927 filed on Jun. 28, 2018, which are hereby incorporated by reference in their entirety.

FIELD OF THE DISCLOSURE

The present invention relates to an optical film for a mini LED or micro LED backlight unit, and more specifically, to an optical film that diffuses and collects the light from mini LEDs or micro LEDs.

DESCRIPTION OF THE BACKGROUND

With the progress of research on light emitting diodes (LEDs), the light energy conversion efficiency of LEDs increases, and LEDs are rapidly replacing conventional light emitting devices.

LEDs currently being developed have advantages such as a compact and lightweight size and low power consumption. Thus, LEDs are widely used as a light source for various display devices.

General backlight units are divided into an edge type and a direct type according to the structure in which the LED light source is placed. The edge type has a structure in which one light source or a pair of light sources are disposed on one side of the light guide plate, or two or two pairs of light sources are disposed on two or four sides of the light guide plate. The direct type has a structure in which multiple light sources are placed under the optical sheet.

The direct type has the advantage of being suitable for a large-area image display device because it is capable of separated driving and thus more delicate image display compared to the edge type and has the ability to selectively turn on/off the LEDs.

Meanwhile, the chip size of an LED tends to gradually reduce. As the LED light source becomes smaller in size, the power consumption of the image display device may be reduced, and light uniformity may be improved.

SUMMARY

According to the present invention, there is provided an optical film that efficiently and uniformly diffuses and collects the light from mini LEDs or micro LEDs.

According to an embodiment of the present invention, an optical film transmitting light emitted from a mini light emitting diode (LED) or micro LED may comprise a first diffusing sheet having a first surface to which the light is radiated and on which a bead diffusion layer including beads for diffusing the light is formed and a second surface on which a pattern diffusion layer including a pattern for diffusing the light is formed and a first prism sheet having a plurality of prisms formed on one surface thereof in a predetermined direction to collect the light transmitted through the first diffusing sheet. The bead diffusion layer and the pattern diffusion layer of the first diffusing sheet may be formed so that a first diffusion rate of the light on the first surface of the first diffusing sheet is larger than a second diffusion rate of the light on the second surface of the first diffusing sheet.

According to various embodiments of the present invention, there may be provided an optical film that efficiently and uniformly diffuses and collects the light from mini LEDs or micro LEDs.

DETAILED DESCRIPTION

Hereinafter, embodiments of the present invention are described in detail with reference to the accompanying drawings. When determined to make the subject matter of the present disclosure unclear, the detailed of the known functions or configurations may be skipped. The terms as used herein are defined considering the functions in the present invention and may be replaced with other terms according to the intention or practice of the user or operator. Therefore, the terms should be defined based on the overall disclosure.

The backlight unit is a light source of a liquid crystal display (LCD). The LCD is an element that, by itself, may not emit light. Thus, a backlight unit with a light source emits light to the LCD panel from the back surface of the LCD. By so doing, an identifiable image may be implemented.

The backlight unit uses, e.g., a cold cathode fluorescent lamp (CCFL), external electrode fluorescent lamp, or light emitting diode (LED) as a light source.

The backlight unit is classified as an edge type or direct type depending on the structure in which the light source is placed. As compared with the edge type, the direct type is capable of separated driving and is thus able to more delicately implement images.

Hereinafter, an optical film included in a direct-type LED backlight unit is described in detail.

Figure 1:
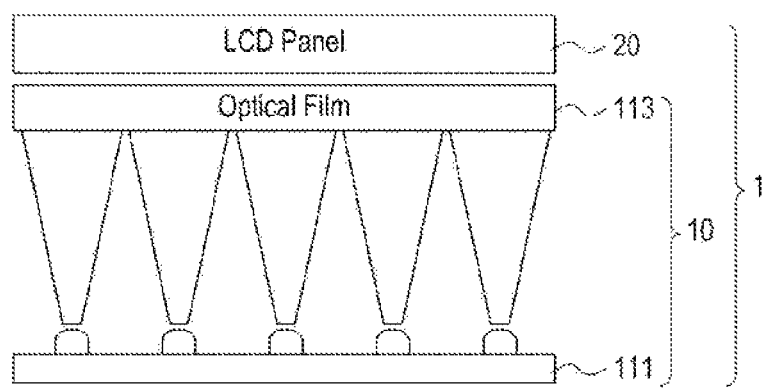
FIG. 1 is a cross-sectional view illustrating an LCD device according to an embodiment of the present invention.

FIG. 1 is a cross-sectional view illustrating an LCD device according to an embodiment of the present invention.

Referring to FIG. 1, an LCD device 1 may include an LED backlight unit 10 and an LCD panel 20.

The LED backlight unit 10 may include a direct-type LED 111 and an optical film 113.

Figure 2:
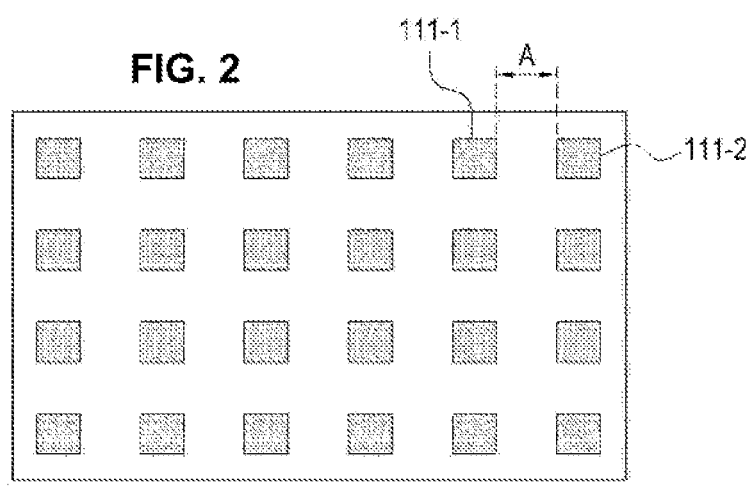
FIG. 2 is a view illustrating a direct-type LED according to an embodiment of the present invention.

Referring to FIG. 2, the direct-type LED 111 may include a plurality of LEDs 111 arranged in grid on a plate-shaped base. In this case, the distance A between the pluralities of LEDs 111 may be set to a predetermined value.

The optical film 113 may include at least one diffusing sheet and at least one prism sheet. Here, the diffusing sheet uniformly diffuses the light emitted from the direct-type LED 111. Here, the prism sheet has a plurality of triangular prisms to collect the light diffused by the diffusing sheet.

Figure 3:
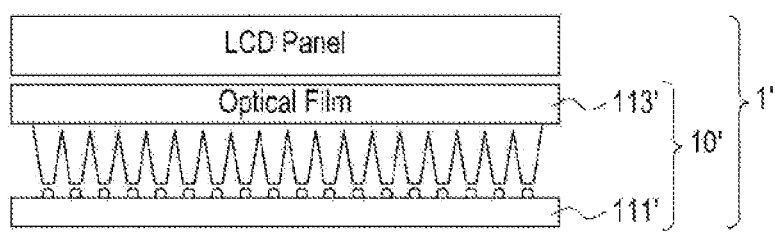
FIG. 3 is a cross-sectional view illustrating an LCD device according to another embodiment of the present invention.

FIG. 3 is a cross-sectional view illustrating an LCD device according to another embodiment of the present invention.

What has been described above in connection with FIGS. 1 and 2 is not further described below.

Figure 4:
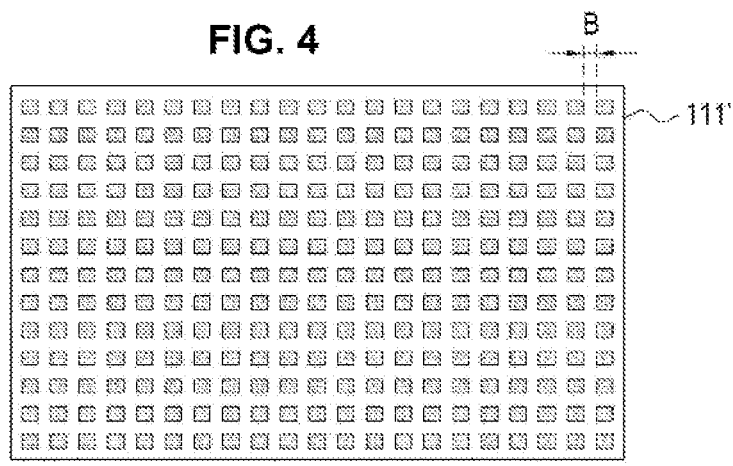
FIG. 4 is a view illustrating a direct-type mini LED or direct-type micro LED according to an embodiment of the present invention.

Referring to FIG. 3, a direct-type LED 111' may include a plurality of miniaturized LEDs 111' (hereinafter, collectively referred to as a mini LED or micro LED) arranged in grid on a plate-shaped base. Referring to FIG. 4, as the mini LED or micro LED 111' is used as a backlight unit, the distance B between the plurality of mini LEDs or micro LEDs 111' may be set to be smaller than the distance A between the pluralities of LEDs 111.

LEDs may be divided into large LEDs (chip size: 1,000μm or more), middle LEDs (chip size: 300-500 μm), small LEDs (chip size: 200-300 μm), mini LEDs (chip size: 100-200 μm), and micro LEDs (chip size: 100 μm or less).

Here, the LEDs are not limited as divided depending on the above-described sizes. For example, the mini LED or micro LED 111' may be defined as an LED whose chip size is 200 μm or less. Mini LED and micro LED may be collectively referred to as an ultra-small LED.

As the chip size of the LED in the backlight unit reduces, the number of LEDs may be easy to adjust so that the LCD device 1 or 1' may have improved brightness characteristics and color uniformity and be slimmed down.

The reduced chip size of the LED may lead to power savings and hence a reduction in the battery power of the portable device and an increase in battery life.

Further, when the mini LED or micro LED 111' is used as compared with the conventional direct-type LED, local dimming may be rendered possible thanks to the reduced LED size. Local dimming may lead to better image quality and efficient power consumption. Here, local dimming is technology for controlling the brightness of the LEDs used as a backlight based on the configuration or characteristics of the screen and this technology may significantly improve the contrast ratio and reduce power consumption. As an example of local dimming, the brightness of the mini LED or micro LED 111' corresponding to a dark screen may be relatively darkened to express a dark color, and the brightness of the mini LED or micro LED 111' corresponding to a bright screen may be relatively brightened to express a vivid color.

However, as the LED is miniaturized, it is needed to allow light to be diffused more easily and uniformly, and a method to do so is to control the beam angle of the light by inserting a lens in the LED. Such method may be difficult to apply to mini LEDs or micro LEDs. Thus, it is required to improve the optical film 113' that is in charge of light diffusion. In particular, it is required to configure the diffusing sheet included in the optical film 113' to be optimized for diffusion of the light from the mini LED or micro LED 111'. The optical film 113' is described below in further detail with reference to various embodiments.

Figure 5:
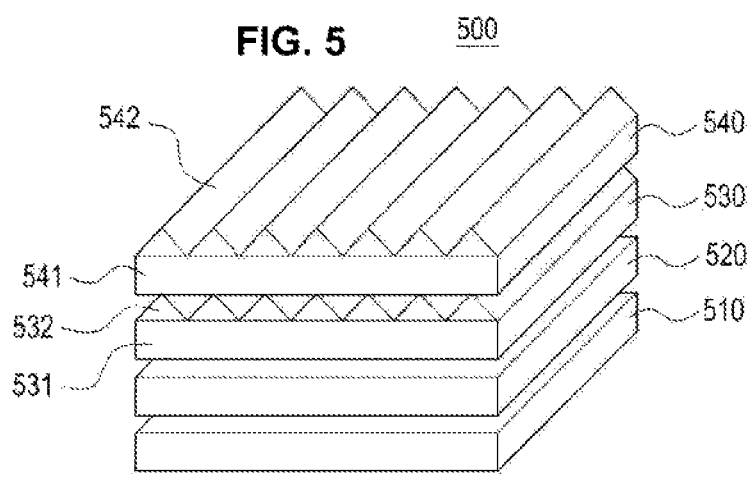
FIG. 5 is a view illustrating an optical film according to an embodiment of the present invention.

FIG. 5 is a view illustrating an optical film according to an embodiment of the present invention.

Referring to FIG. 5, an optical film 500 includes diffusing sheets 510 and 520 and prism sheets 530 and 540.

The diffusing sheets 510 and 520 may include a first diffusing sheet 510 and a second diffusing sheet 520.

The first diffusing sheet 510 may diffuse the light emitted from under the first diffusing sheet 510.

The second diffusing sheet 510 may be disposed on the first diffusing sheet 510, diffusing the light transmitted through the first diffusing sheet 510.

The first diffusing sheet 510 and the second diffusing sheet 520 may include a transparent or semi-transparent film (e.g., PET, PC, PES, COP, PE, PEN, or PAR) and at least one of a bead diffusion layer including beads for diffusing light and a pattern diffusion layer having a pattern for diffusing light. Here, the bead diffusion layer may be formed by applying a curable resin (e.g., one or a combination of at least one or more selected from among urethane acrylate, epoxy acrylate, ester acrylate, and radical-generating monomer) containing light diffusing beads and cause light diffusion by the light diffusing beads. The pattern diffusion layer has a protruding pattern having a shape (e.g., a sphere) sized uniformly or non-uniformly, prompting light diffusion.

Each of the prism sheets 530 and 540 may have a plurality of prisms on the top surface thereof in a predetermined direction so as to collect the light transmitted through the first diffusing sheet 510 and the second diffusing sheet 520.

Each of the prism sheets 530 and 540 may have a plurality of prisms 532 and 542 (or lenticular lenses) on the top surface of a PET film (or base film 531 or 541). Here, the plurality of prisms 532 and 542 play a role to collect the light transmitted through the first diffusing sheet 510 and the second diffusing sheet 520, improving the brightness (or luminance) within a view range of the LCD device 1 or 1'.

The plurality of prisms 532 and 542 may be in the form of a single inverted prism sheet or in the form of a non-inverted prism sheet in which a plurality of prisms have been stacked and bonded together.

The plurality of prisms 532 arranged on the first prism sheet 530 of the prism sheets 530 and 540 may be arranged in a first direction on the top surface of the first prism sheet 530, and the plurality of prisms 542 arranged on the second prism sheet 540 of the prism sheets 530 and 540 may be arranged in a direction perpendicular to the first direction of the top surface of the first prism sheet 530.

The way in which the diffusing sheets 510 and 520 and the prism sheets 530 and 540 are arranged is not limited to the embodiment of FIG. 5. Specifically, the first diffusing sheet 510, the second diffusing sheet 520, the first prism sheet 530, and the second prism sheet 540 may be arranged in a random order. As an example, the first diffusing sheet 510, the second diffusing sheet 530, the second prism sheet 540, and the second diffusing sheet 520 may be arranged in the order thereof.

Various embodiments of an optical film configured to be suitable for a mini LED or micro LED backlight unit are described below with reference to FIGS. 6 to 11.

Figure 6:
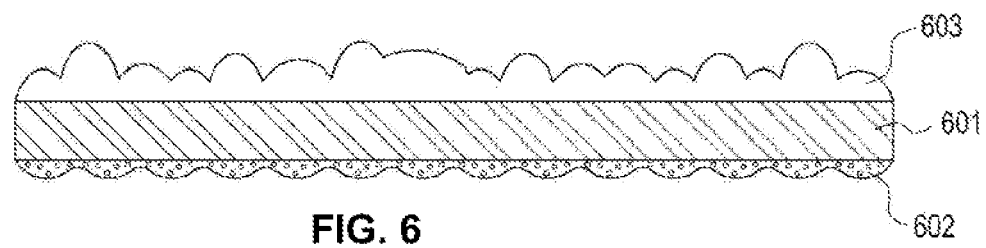
FIG. 6 is a cross-sectional view illustrating an optical film according to an embodiment of the present invention.

FIG. 6 is a cross-sectional view illustrating an optical film according to an embodiment of the present invention.

Referring to FIG. 6, an optical film includes a diffusing sheet 600. The diffusing sheet 600 includes a base film (or PET film) 601, a bead diffusion layer 602, and a pattern diffusion layer 603.

The base film 601 corresponds to a body portion of the diffusing sheet 600. As an example, the base film 601 serves as a body where the bead diffusion layer 602 and the pattern diffusion layer 603 may be formed.

The bead diffusion layer 602 may be formed on one surface of the diffusing sheet 600. The light from the mini LED or micro LED may be emitted to the bead diffusion layer 602. The bead diffusion layer 602 may include beads for diffusing light.

The pattern diffusion layer 603 may be formed on the opposite surface of the diffusing sheet 600. The pattern diffusion layer 603 may include/be formed with a pattern for diffusing light.

The optical film may further include a prism sheet. Here, the prism sheet may have a plurality of prisms formed on one surface thereof in a predetermined direction so as to collect the light transmitted through the diffusing sheet 600.

In this case, the bead diffusion layer 602 and the pattern diffusion layer 603 may be formed so that a first diffusion rate of the light on one surface of the diffusing sheet 600 is larger than a second diffusion rate of the light on the opposite surface.

Here, the first diffusion rate may be determined based on the density of the beads included in the bead diffusion layer 602. The second diffusion rate may be determined based on at least one of the shape and density of the pattern included in the pattern diffusion layer 603.

In this case, the shape of the pattern may include a sphere, wave, or polygon. The density of the pattern may be the degree at which a predefined size of pattern is dense. As an example, the pattern may be formed in an area but not in another area.

The optical sheet may include an additional diffusing sheet. Here, a bead diffusion layer or pattern diffusion layer for diffusing light may be formed on at least one of two opposite surfaces of the additional diffusing sheet.

Figure 7:
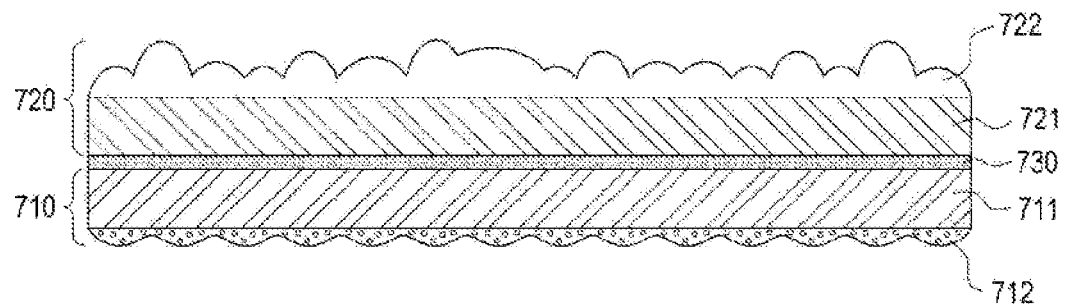
FIG. 7 is a cross-sectional view illustrating an optical film according to another embodiment of the present invention.

FIG. 7 is a cross-sectional view illustrating an optical film according to another embodiment of the present invention.

Referring to FIG. 7, an optical sheet 700 includes a first diffusing sheet 710 and a second diffusing sheet 720. The top surface (or one surface) of the first diffusing sheet 710 and the bottom surface (or opposite surface) of the second diffusing sheet 720 may be attached by an adhesive 730.

The optical sheet 700 may be configured to allow the light from the mini LED or micro LED to be uniformly diffused.

For example, a bead diffusion layer 710 including beads for diffusing light may be formed on one (e.g., the bottom surface in FIG. 7) of the top or bottom surface of the first diffusing sheet 710 (or a first PET 711), and a pattern diffusion layer 722 having a pattern for diffusing light may be formed on one (e.g., the top surface in FIG. 7) of the top or bottom surface of the second diffusing sheet 720 (or a second PET 721) so that the light diffusion rate on the first diffusing sheet 710 is larger than the light diffusion rate on the second diffusing sheet 720.

Here, the light diffusion rate may be defined as, e.g., a haze value, and the haze value may be defined as in Equation 1 below. Here, the unit of the haze value may be %.

$$\frac{\text{total amount of light transmitted} - }{\text{total amount of light transmitted}} \times 100 \quad \text{[Equation 1]}$$

Specifically, the diffusing sheets 710 and 720 of the optical sheet 700 may have haze. Haze may refer to the phenomenon that a transparent material appears milky or hazy depending on the unique characteristics of the material as light is scattered or diffused while passing through the material.

A desired brightness and viewing angle (or field of view) may be implemented by adjusting the haze value. As an example, when the haze value is 30% or less, the viewing angle (or field of view) may be reduced as the diffusion rate of light is low and, when the haze value is 90% or more, the brightness is decreased as the transmittance rate of light is low.

The haze value may be adjusted by forming a diffusion layer, such as the bead diffusion layer 712 or the pattern diffusion layer 722.

The mini LED or micro LED may have a reduced light strength or light arrival area as compared with other small-size LEDs which used to be typically adopted for backlights. Thus, use of mini LEDs or micro LEDs as a backlight may require a diffusing sheet with a higher diffusion rate than that for conventional direct-type LEDs. To that end, the optical sheet 700 may be configured so that the first diffusing sheet 710, which is first irradiated, has a higher light diffusion rate than the second diffusing sheet 720.

FIGS. 8 to 11 illustrate other example optical films configured to uniformly diffuse the light from a mini LED or micro LED. No duplicate description of substantially the same components or configurations as those described above in connection with FIG. 7 is given below.

Figure 8:
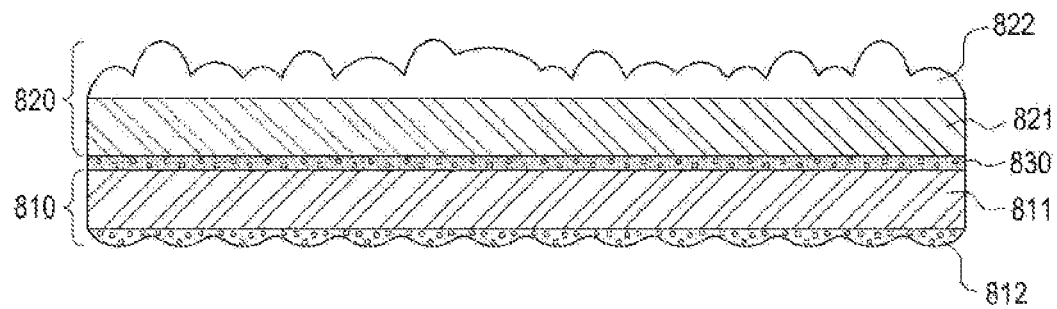
FIG. 8 is a cross-sectional view illustrating an optical film according to still another embodiment of the present invention.

FIG. 8 is a cross-sectional view illustrating an optical film according to an embodiment.

Referring to FIG. 8, a bead diffusion layer 812 including beads for diffusing light may be formed on the top or bottom surface (e.g., the bottom surface as shown in FIG. 8) of a first diffusing sheet 810 (or a first PET 811), while a pattern diffusion layer 822 having a pattern formed to diffuse light may be formed on the top or bottom surface (e.g., the top surface as shown in FIG. 8) of a second diffusing sheet 820 (or a second PET 821), so that the first diffusing sheet 810 has a higher light diffusion rate than the second diffusing sheet 820. In this case, an adhesive 830 may be applied between the top surface of the first diffusing sheet 810 and the bottom of the second diffusing sheet 820 to attach the first diffusing sheet 810 and the second diffusing sheet 820. The adhesive 830 may include a plurality of beads to increase the light diffusion rate of the mini LED or micro LED.

As described above, the optical film 800 of FIG. 8 may be configured so that the first diffusing sheet 810, which is first irradiated with light, has a higher light diffusion rate than the second diffusing sheet 820.

Figure 9:
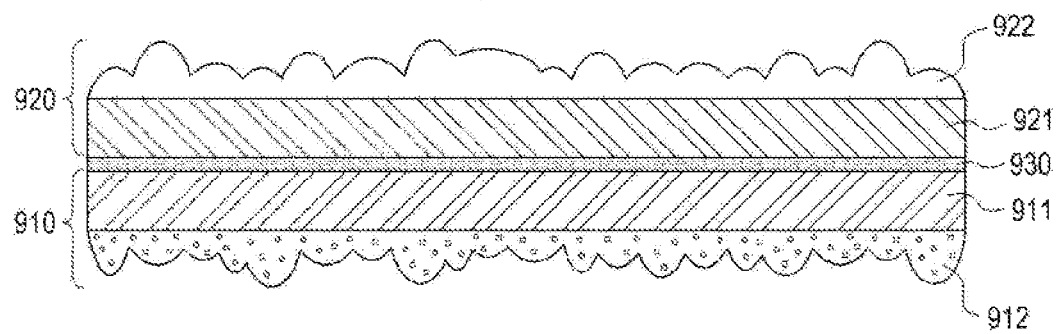
FIG. 9 is a cross-sectional view illustrating an optical film according to still another embodiment of the present invention.

FIG. 9 is a cross-sectional view illustrating an optical film according to an embodiment.

Referring to FIG. 9, a bead diffusion layer 912 includes beads for diffusing light and allowing a first diffusing sheet 910 to have a higher light diffusion rate than a second diffusing sheet 920, may be formed on one (e.g., the bottom surface in FIG. 9) of the top or bottom surface of the first diffusing sheet 910 (or a first PET 911), and a pattern diffusion layer 922 having a pattern for diffusing light may be formed on one (e.g., the top surface in FIG. 9) of the top or bottom surface of the second diffusing sheet 920 (or a second PET 921). In this case, the top surface of the first diffusing sheet 910 and the bottom surface of the second diffusing sheet 920 may be attached by an adhesive 930. The bead diffusion layer 912 of the first diffusing sheet 910 may include a pattern for diffusing light.

As described above, the optical film 900 of FIG. 9 may be configured so that the light diffusion rate of the first diffusing sheet 910 to which light is first radiated is higher than the light diffusion rate of the second diffusing sheet 920.

Figure 10:
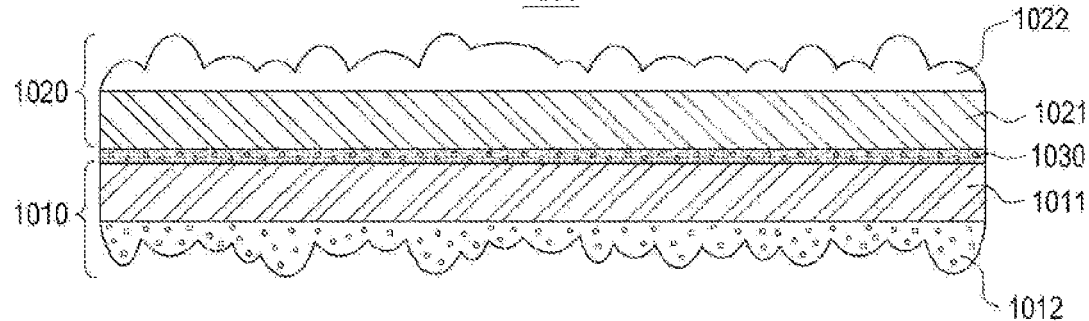
FIG. 10 is a cross-sectional view illustrating an optical film according to still another embodiment of the present invention.

FIG. 10 is a cross-sectional view illustrating an optical film according to still another embodiment of the present invention.

Referring to FIG. 10, a pattern diffusion layer 1012 including beads for diffusing light may be formed on one (e.g., the bottom surface in FIG. 10) of the top or bottom surface of the first diffusing sheet 1010 (or a first PET 1011), and a pattern diffusion layer 1022 having a pattern for diffusing light may be formed on one (e.g., the top surface in FIG. 10) of the top or bottom surface of the second diffusing sheet 1020 (or a second PET 1021) so that the light diffusion rate on the first diffusing sheet 1010 is larger than the light diffusion rate on the second diffusing sheet 1020. In this case, the top surface of the first diffusing sheet 1010 and the bottom surface of the second diffusing sheet 1020 may be attached by an adhesive 1030. The adhesive 1030 may include a plurality of beads to increase the light diffusion rate of the mini LED or micro LED.

As described above, the optical film 1000 of FIG. 10 may be configured so that the light diffusion rate of the first diffusing sheet 1010 to which light is first radiated is higher than the light diffusion rate of the second diffusing sheet 1020.

Figure 11:
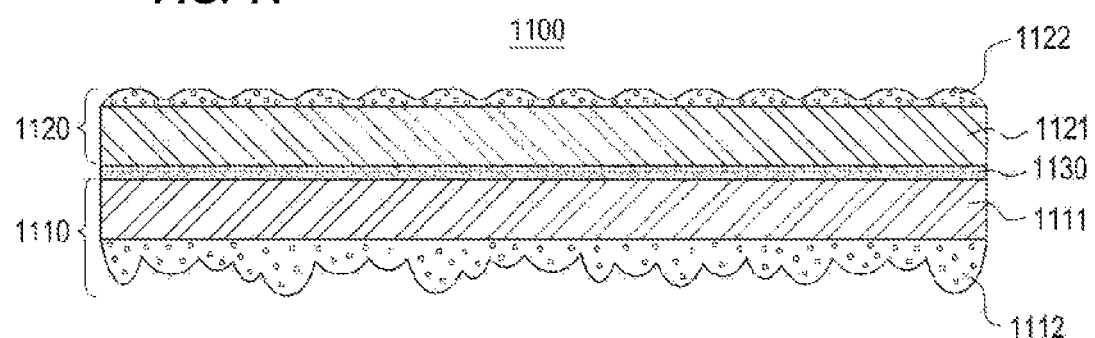
FIG. 11 is a cross-sectional view illustrating an optical film according to still another embodiment of the present invention.

FIG. 11 is a cross-sectional view illustrating an optical film according to still another embodiment of the present invention.

Referring to FIG. 11, a pattern diffusion layer 1112 including beads for diffusing light may be formed on one (e.g., the bottom surface in FIG. 11) of the top or bottom surface of the first diffusing sheet 1110 (or a first PET 1111), and a bead diffusion layer 1122 having beads for diffusing light may be formed on one (e.g., the top surface in FIG. 11) of the top or bottom surface of the second diffusing sheet 1120 (or a second PET 1121) so that the light diffusion rate on the first diffusing sheet 1110 is larger than the light diffusion rate on the second diffusing sheet 1120. In this case, the top surface of the first diffusing sheet 1110 and the bottom surface of the second diffusing sheet 1120 may be attached by an adhesive 1130.

As described above, the optical film 1100 of FIG. 11 may be configured so that the light diffusion rate of the first diffusing sheet 1110 to which light is first radiated is higher than the light diffusion rate of the second diffusing sheet 1120.

Meanwhile, the distance between the LED and the optical film may be defined as an optical distance (OD).

As an example, FIGS. 1 and 3 may illustrate an example in which the OD is set so that the dark space and overlapping area (bright space) are minimized according to light radiation.

Figure 12:
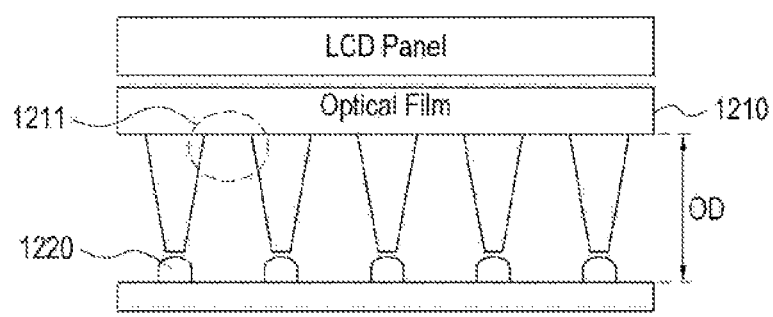
FIG. 12 is a view illustrating a form in which LED light is emitted according to an embodiment of the present invention.

FIG. 12 is a view illustrating a form in which light is emitted according to an embodiment of the present invention.

As an example, FIG. 12 may illustrate an example in which the same number of mini LEDs or micro LEDs as small or large LEDs are arranged in the backlight unit.

In this case, the dark space 1211 may be distributed, with a predetermined OD maintained between the mini LED or micro LED 1220 and the optical film 1210.

To slim down the display device, it may be necessary to reduce the OD. If the OD is reduced, the dark space 1211 may be expanded. In this case, the dark space 1211 may be effectively shrunken by increasing the light diffusion rate using diffusing sheets according to the above-described embodiments of the present invention.

For example, the bead diffusion layer of the first diffusing sheet included in the optical film 1210 may be formed so that the area where the light radiation has a predefined strength or more differs in bead density from the area where the light radiation has a strength smaller than the predefined strength.

As an example, in the area where the light radiation has the predefined strength or more, the bead density may be relatively high to allow the light to be diffused more easily and, in the area where the light radiation has a strength less than the predefined strength, the bead density may be relatively low.

As another example, the pattern diffusion layer of the second diffusing sheet included in the optical film 1210 may be formed so that the area where the light radiation has a predefined strength or more differs in pattern from the area where the light radiation has a strength smaller than the predefined strength.

As an example, in the area where the light radiation has the predefined strength or more, the pattern protrusions may be arranged relatively more densely to allow the light to be diffused more easily and, in the area where the light radiation has a strength less than the predefined strength, the pattern protrusions may be arranged relatively less densely.

Various embodiments of an optical film configured so that the light diffusion rate of the first diffusing sheet to which light is first radiated is higher than the light diffusion rate of the second diffusing sheet have been described above in detail.

According to such various embodiments, as the first diffusing sheet and the second diffusing sheet have different diffusion rates, active multi-light diffusion may occur. Thus, light may be effectively diffused.

Although embodiments of the present invention have been shown and described, it will be easily appreciated by one of ordinary skill in the art that various changes may be made thereto without departing from the spirit and scope of the embodiments as defined by the appended claims and equivalents thereof.

What is claimed is:

1. An optical film transmitting light emitted from a mini light emitting diode (LED) or micro LED, the optical film comprising:
   a first diffusing sheet including a first surface to which the light is radiated and on which a bead diffusion layer including beads for changing a diffusion rate of the light is formed and a second surface on which an adhesive layer is disposed;
   a second diffusing sheet disposed on the adhesive layer and including a pattern diffusion layer changing a diffusion rate of the light on a light existing surface; and
   a first prism sheet disposed on the second diffusing sheet and having a plurality of prisms formed on one surface thereof in a predetermined direction to collect the light transmitted through the second diffusing sheet,
   wherein a first diffusion rate of the light of the bead diffusion layer is larger than a second diffusion rate of the light of the pattern diffusion layer.

2. The optical film of claim 1, wherein the first diffusion rate or the second diffusion rate is a haze value, and
wherein the haze value is defined as
(total amount of light transmitted−amount of light travelling straight)×100/total amount of light transmitted.

3. The optical film of claim 1, wherein the first diffusion rate is determined based on a density of the beads included in the bead diffusion layer, and the second diffusion rate is determined based on at least one of a shape and density of the pattern included in the pattern diffusion layer.

4. The optical film of claim 1, wherein the bead diffusion layer of the first diffusing sheet is further formed with a pattern for diffusing the light.

5. The optical film of claim 1, wherein the bead diffusion layer has a different pattern from the pattern diffusion layer.

6. The optical film of claim 1, wherein the adhesive layer includes the beads for diffusing the light.

7. The optical film of claim 1, wherein the bead diffusion layer of the first diffusing sheet has a different bead density for an area where the light is radiated in a predefined strength and an area where the light is radiated in a strength less than the predefined strength.

8. The optical film of claim 1, wherein the pattern diffusion layer of the second diffusing sheet has a different pattern shape or density for an area where the light is radiated in a predefined strength and an area where the light is radiated in a strength less than the predefined strength.

9. The optical film of claim 1, further comprising a second prism sheet that comprises:
a plurality of prisms arranged on the first prism sheet are arranged in a first direction on a first surface of the first prism sheet, and
a plurality of prisms arranged on the second prism sheet are arranged on a first surface of the second prism sheet in a direction perpendicular to the first direction of the first surface of the first prism sheet.

* * * * *